United States Patent
Mandl et al.

(10) Patent No.: US 9,214,600 B2
(45) Date of Patent: Dec. 15, 2015

(54) OPTOELECTRONIC SEMICONDUCTOR CHIP

(71) Applicant: OSRAM Opto Semiconductors GmbH, Regensburg (DE)

(72) Inventors: Martin Mandl, Lappersdorf (DE);
Martin Straßburg, Donaustauf (DE);
Christopher Kölper, Regensburg (DE);
Alexander Pfeuffer, Regensburg (DE);
Patrick Rode, Regensburg (DE);
Johannes Ledig, Braunschweig (DE);
Richard Neumann, Munich (DE);
Andreas Waag, Würzburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/382,286

(22) PCT Filed: Feb. 20, 2013

(86) PCT No.: PCT/EP2013/053371
§ 371 (c)(1),
(2) Date: Aug. 29, 2014

(87) PCT Pub. No.: WO2013/127672
PCT Pub. Date: Sep. 6, 2013

(65) Prior Publication Data
US 2015/0021636 A1    Jan. 22, 2015

(30) Foreign Application Priority Data
Mar. 1, 2012    (DE) .......................... 10 2012 101 718

(51) Int. Cl.
*H01L 33/00* (2010.01)
*H01L 33/08* (2010.01)
(Continued)

(52) U.S. Cl.
CPC ................ *H01L 33/08* (2013.01); *H01L 33/18* (2013.01); *H01L 33/42* (2013.01); *H01L 33/62* (2013.01); *H01L 33/385* (2013.01); *H01L 2933/0016* (2013.01)

(58) Field of Classification Search
CPC ......... H01L 33/08; H01L 33/18; H01L 33/62; H01L 33/42; H01L 33/385; H01L 2933/0016
See application file for complete search history.

(56) References Cited

U.S. PATENT DOCUMENTS

| 7,521,274 B2 | 4/2009 | Hersee et al. |
| 8,330,173 B2 * | 12/2012 | Kim ................................ 257/93 |

(Continued)

FOREIGN PATENT DOCUMENTS

| DE | 102009056712 A1 | 6/2011 |
| DE | 102010012711 A1 | 9/2011 |

(Continued)

*Primary Examiner* — Nikolay Yushin
(74) *Attorney, Agent, or Firm* — Slater & Matsil, L.L.P.

(57) ABSTRACT

An optoelectronic semiconductor chip includes a number active regions that are arranged at a distance from each other and a substrate that is arranged on an underside of the active regions. One of the active regions has a main extension direction. The active region has a core region that is formed using a first semiconductor material. The active region has an active layer that covers the core region at least in directions perpendicular to the main extension direction of the active region. The active region has a cover layer that is formed using a second semiconductor material and covers the active layer at least in directions perpendicular to the main extension direction of the active region.

19 Claims, 8 Drawing Sheets

(51) Int. Cl.
*H01L 33/18* (2010.01)
*H01L 33/42* (2010.01)
*H01L 33/62* (2010.01)
*H01L 33/38* (2010.01)

(56) References Cited

U.S. PATENT DOCUMENTS

| | | | |
|---|---|---|---|
| 8,653,538 B2 | 2/2014 | Ha et al. | |
| 8,878,231 B2* | 11/2014 | Yi et al. | 257/103 |
| 8,895,958 B2 | 11/2014 | Fukui et al. | |
| 8,907,321 B2* | 12/2014 | Tansu et al. | 257/14 |
| 2005/0179052 A1* | 8/2005 | Yi et al. | 257/183 |
| 2007/0041214 A1 | 2/2007 | Ha et al. | |
| 2008/0157057 A1* | 7/2008 | Kim | 257/13 |
| 2009/0090900 A1 | 4/2009 | Avramescu et al. | |
| 2010/0155767 A1 | 6/2010 | Lee et al. | |
| 2011/0012167 A1 | 1/2011 | Shimamura et al. | |
| 2011/0095260 A1* | 4/2011 | Kim | 257/13 |
| 2011/0140072 A1 | 6/2011 | Varangis et al. | |
| 2011/0147702 A1* | 6/2011 | Tansu et al. | 257/13 |
| 2011/0240959 A1 | 10/2011 | Konsek et al. | |
| 2012/0025232 A1* | 2/2012 | Gwo et al. | 257/94 |
| 2012/0061646 A1* | 3/2012 | Yi et al. | 257/13 |
| 2012/0097920 A1* | 4/2012 | Gwo et al. | 257/13 |
| 2014/0117307 A1* | 5/2014 | Herner et al. | 257/13 |

FOREIGN PATENT DOCUMENTS

| | | |
|---|---|---|
| EP | 1727216 A2 | 11/2006 |
| JP | H10173226 A | 6/1998 |
| JP | H10321910 A | 12/1998 |
| JP | 2002016312 A | 1/2002 |
| JP | 2006332650 A | 12/2006 |
| JP | 2008282966 A | 11/2008 |
| JP | 2009542560 A | 12/2009 |
| WO | 2009009612 A2 | 1/2009 |
| WO | 2011067872 A1 | 6/2011 |

* cited by examiner

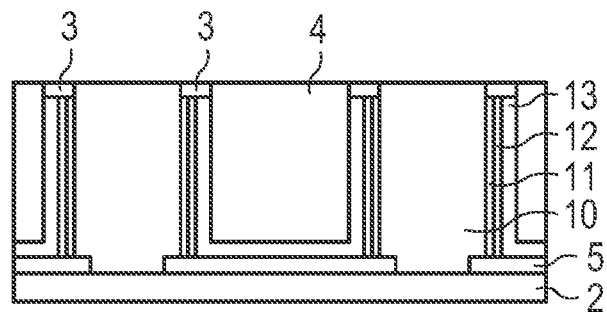
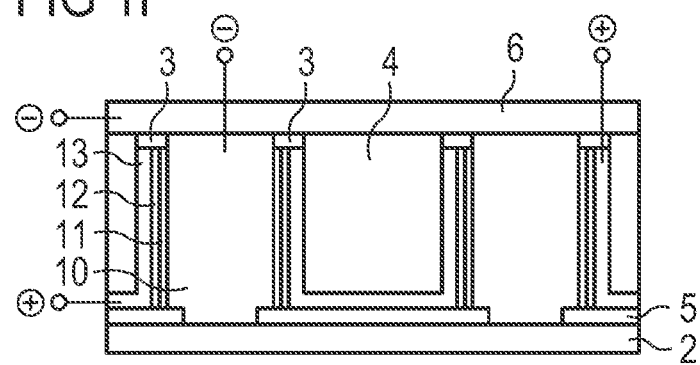
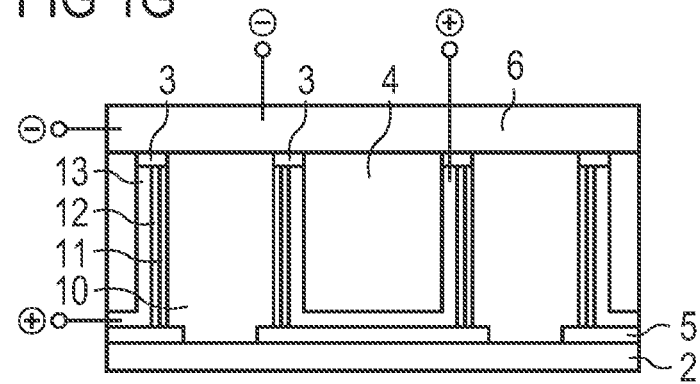

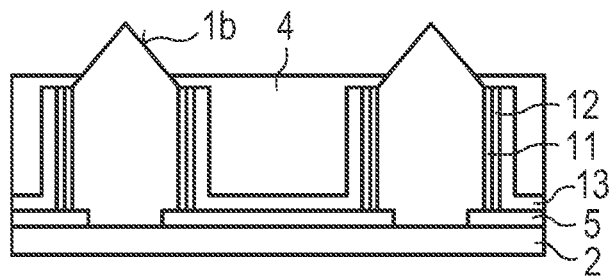
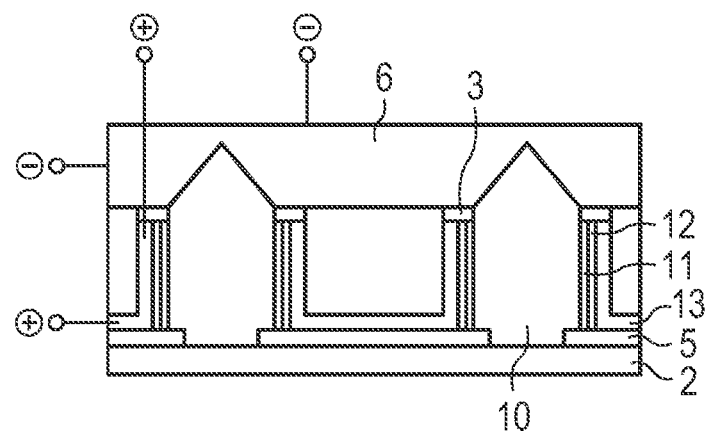
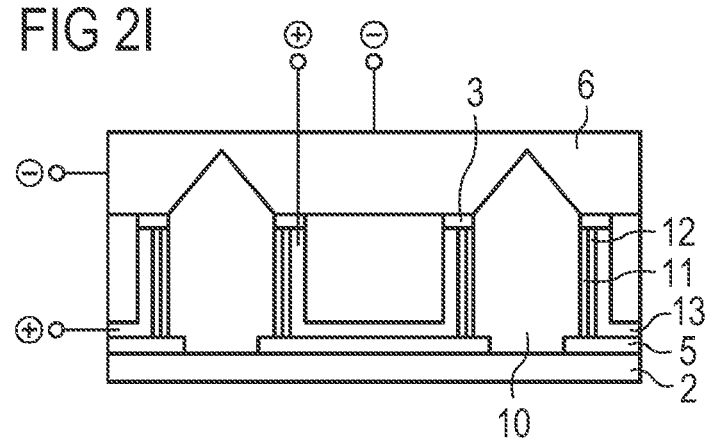

OPTOELECTRONIC SEMICONDUCTOR CHIP

This patent application is a national phase filing under section 371 of PCT/EP2013/053371, filed Feb. 20, 2013, which claims the priority of German patent application 10 2012 101 718.2, filed Mar. 1, 2012, each of which is incorporated herein by reference in its entirety.

TECHNICAL FIELD

An optoelectronic semiconductor chip is specified.

SUMMARY OF THE INVENTION

Embodiments of the invention specify an optoelectronic semiconductor chip which can be operated particularly efficiently.

The optoelectronic semiconductor chip described here is, in particular, a radiation-emitting optoelectronic semiconductor chip. By way of example, it is an optoelectronic semiconductor chip which emits UV radiation, visible light or infrared radiation during operation. The optoelectronic semiconductor chip is, in particular, a light-emitting diode chip. Furthermore, it is possible for the semiconductor chip to be a radiation-receiving optoelectronic semiconductor chip, for example, a solar cell or a photodiode.

In accordance with at least one embodiment of the optoelectronic semiconductor chip, the optoelectronic semiconductor chip comprises at least one active region. In particular, the optoelectronic semiconductor chip comprises a multiplicity of active regions, which are arranged at a distance from one another. During the operation of the optoelectronic semiconductor chip, electromagnetic radiation, in particular light, is generated in the active regions and at least partly leaves the semiconductor chip. Alternatively, it is possible for electromagnetic radiation to be converted into charge carriers in the active regions.

In the extreme case it is also possible here for the optoelectronic semiconductor chip to comprise exactly one active region. Such a semiconductor chip can be used in particular in communications technology.

The optoelectronic semiconductor chip comprises a multiplicity of active regions arranged in each case at a distance from one another. In this case, it is possible for the active regions to be connected to one another by a further element at an underside and/or at a top side. In this case, the active regions are at a distance from one another in a region between their underside and their top side and are not connected to one another there.

The active regions can be arranged, for example, in the manner of a regular lattice. That is to say that the active regions are arranged at predefined distances from one another; a regular lattice structure, such as, for example, the structure of a rectangular lattice or of a triangular lattice, is discernible, for example, in a plan view of the top sides of the active regions. However, a random distribution of the active regions is also possible.

One active region of the multiplicity of active regions is usually discussed hereinafter. Preferably, a large portion of the active regions, in particular all of the active regions, have the properties described for the one region.

In accordance with at least one embodiment of the optoelectronic semiconductor chip, the optoelectronic semiconductor chip comprises a carrier. The carrier is arranged at an underside of the multiplicity of active regions. The carrier is that element of the optoelectronic semiconductor chip which mechanically carries and supports the multiplicity of active regions. By way of example, the carrier can also be that element of the optoelectronic semiconductor chip which connects the multiplicity of active regions to one another.

The carrier can be, for example, a growth substrate for at least parts of the active regions. For this purpose, the carrier can be formed, for example, from GaAs, silicon, glass or sapphire. Furthermore, it is possible for the carrier to contain at least one of the materials mentioned. If the carrier is a growth substrate, then the growth substrate remains in the semiconductor chip and, in particular, is not removed. However, thinning of the growth substrate, that is to say reducing the thickness of the growth substrate, for example, by grinding, etching or chemical mechanical polishing, is possible.

The carrier can be embodied as radiation-transmissive, for example, transparent, radiation-reflecting or diffusely scattering. That is to say that electromagnetic radiation that is generated or is to be detected in the active regions during the operation of the semiconductor chip, for example, can pass through the carrier or is reflected or scattered at the latter.

In addition, it is possible for the carrier to be embodied in an electrically insulating fashion. By way of example, the carrier can be formed with a radiation-transmissive, electrically insulating material such as sapphire, which serves as a growth substrate for a semiconductor material of the multiplicity of active regions.

In accordance with at least one embodiment of the optoelectronic semiconductor chip, at least one of the active regions has a main extension direction. That is to say that the active region does not extend equally far in every spatial direction, rather there is a preferred direction, the main extension direction, in which the active region has its greatest extension.

By way of example, the active region can have the shape of a cylinder, the shape of a truncated cone, the shape of a pyramid, or the shape of a prism, in particular with a hexagonal or triangular base surface. The main extension direction is then that direction in which the height of the cylinder, of the truncated cone or of the prism is determined. In other words, the at least one active region is formed by an elongated, three-dimensional body and, for example, does not have the form of a planar layer. Furthermore, the active region is not a continuous, unstructured layer having, for example, a plane outer surface.

In accordance with at least one embodiment of the optoelectronic semiconductor chip, the at least one active region has a core region formed with a first semiconductor material. In this case, the first semiconductor material has a first conduction type. By way of example the first semiconductor material is embodied in an n-conducting fashion. The first semiconductor material can be based, for example, on an n-doped III/V semiconductor material system. By way of example, the first semiconductor material is based on an n-doped nitride semiconductor material system. In particular, the first semiconductor material can then be based on n-conducting GaN, InGaN, AlGaN or AlInGaN.

By way of example, at least the first semiconductor material is deposited directly onto the outer surface of the carrier facing the active regions. As first layer, an undoped growth layer can also be deposited, on which in turn the n-conducting material is subsequently applied.

The core region of the active region extends, in particular, along the main extension direction and can have the same shape as the active region. If the active region is embodied, for example, in the shape of a cylinder or prism, then the core region can also have the shape of a cylinder or prism. The core region can then be embodied, in particular, as a solid body consisting of the first semiconductor material.

In accordance with at least one embodiment of the optoelectronic semiconductor chip, the at least one active region comprises an active layer, which covers the core region at least in directions transversely with respect to the main extension direction of the active region. The core region has a lateral surface, for example, which can be partly or in particular completely covered with the material of the active layer. An end face can also be covered at least in places. In this case, the core region can directly adjoin the active layer. During the operation of the optoelectronic semiconductor chip, the radiation generated by the optoelectronic semiconductor chip is generated in the active region, and there in particular in the active layer. Within the scope of production tolerance, the active layer preferably has a uniform thickness, but the latter can change along the main extension direction.

In accordance with at least one embodiment of the optoelectronic semiconductor chip, the at least one active region has a cover layer, which is formed with a second semiconductor material and covers the active layer at least in directions transversely with respect to the main extension direction of the active region. By way of example, the active layer is then arranged between the cover layer and the core region. In this case, the cover layer can partly or completely cover the active layer. Within the scope of production tolerance, the cover layer preferably has a uniform thickness, but the latter can change along the main extension direction.

The second semiconductor material is a semiconductor material of a second conduction type, which differs from the first conduction type. In particular, the second semiconductor material can be based on the same semiconductor material system as the first semiconductor material, but in this case can have a different doping. If the first semiconductor material is formed in an n-conducting fashion, for example, then the second semiconductor material is formed in a p-conducting fashion. By way of example, the second semiconductor material is based on p-GaN, p-InGaN, p-AlGaN or p-AlInGaN or a stack of two or more layers composed of two or more of the materials indicated.

In accordance with at least one embodiment of the optoelectronic semiconductor chip, the semiconductor chip comprises a multiplicity of active regions, which are arranged at a distance from one another. Furthermore, the optoelectronic semiconductor chip comprises a carrier arranged at an underside of the multiplicity of active regions. In this case, at least one of the active regions has a main extension direction, the active region has a core region formed with a first semiconductor material, the active region has an active layer, which covers the core region at least in directions transversely with respect to the main extension direction of the active region, and the active region has a cover layer, which is formed by a second semiconductor material and covers the active layer at least in directions transversely with respect to the main extension direction of the active region.

In this case, the optoelectronic semiconductor chip preferably comprises a multiplicity of active regions constructed such that they are of identical type, for example. Within the scope of production tolerance, these active regions can then be embodied identically. That is to say that each of the active regions then comprises a core region, an active layer and a cover layer, which have an identical material composition in each case within the scope of production tolerance. In particular, it is possible for all active regions of the optoelectronic semiconductor chip to be embodied identically within the scope of production tolerance. However, it is also possible for the optoelectronic semiconductor chip to comprise a multiplicity of active regions embodied at least partly differently. By way of example, the active regions can differ from one another with regard to thickness, that is to say extent in directions transversely with respect to the main extension direction, and/or length, that is to say extent parallel to the main extension direction, and/or composition. Therefore, different active regions can emit light of different colors, such that the semiconductor chip overall emits white light, for example.

The efficiency of, in particular, GaN-based light-emitting diodes is limited by the so-called "droop" effect under operating current conditions. This effect denotes a significant drop in efficiency as the current or charge carrier density rises. Therefore, typical operating currents are significantly beyond the maximum of the efficiency curve. In order to advance to higher efficiencies with current remaining the same, a reduction of the local charge carrier density is therefore advantageous. This could be achieved, for example, by enlarging the cross-sectional area of the optoelectronic semiconductor chip or by increasing the number of active layers. However, both approaches have problems.

In this regard, enlarging the cross-sectional area is not practicable for many applications, for example, the use of the optoelectronic semiconductor chip in a projection device, since this enlargement is accompanied by an increase in the etendue. Moreover, this solution is also always associated with an increase in costs that is usually more than proportional to the increase in the cross-sectional area of the semiconductor chip.

In the case of the optoelectronic semiconductor chip described here, the active regions are embodied, for example, as "core-shell nano- or microrods." As a result of the division of the radiation-emitting region of the optoelectronic semiconductor chip into a multiplicity of active regions, that is to say, for example, a multiplicity of core-shell rods, the active volume in which electromagnetic radiation is generated during operation is increased compared with an optoelectronic semiconductor chip comprising a single active region, which is unstructured, for example. The efficiency of the semiconductor chip is increased in this way.

On account of the fact that an optoelectronic semiconductor chip described here comprises a multiplicity of active regions, a significant enlargement of the active area and thus an increase in efficiency under operating current conditions in conjunction with a reduced charge carrier density are achieved. Furthermore, during the epitaxial growth of the active regions that are at a distance from one another, a reduction of strains in the semiconductor material of the active regions can be achieved compared with a closed two-dimensional layer.

In particular, it is possible for an optoelectronic semiconductor chip described here to comprise one, more than two, more than 100, preferably more than 1000, in particular more than 10,000, or more than 100,000, active regions. By way of example, the active regions are electrically insulated from one another in this case in the region of their lateral surfaces. In this case, it is possible for the active regions to be drivable jointly, in groups or individually.

In accordance with at least one embodiment of the optoelectronic semiconductor chip, the growth direction of the first semiconductor material runs substantially parallel to the main extension direction. That is to say that, within the scope of production tolerance, the growth direction of the first semiconductor material runs parallel to the main extension direction. The first semiconductor material of the core region of the at least one active region is therefore grown in the main extension direction. The active layer and also the cover layer of the active region cover the core region in directions running transversely and in the same direction with respect to the growth direction of the semiconductor material of the core region.

In accordance with at least one embodiment of the optoelectronic semiconductor chip, the active region has a length determined in the main extension direction. That is to say that the length of the active region is measured along the main extension direction. Furthermore, the active region has a diameter or a thickness determined in a direction perpendicular to the main extension direction, that is to say runs in a plane to which the main extension direction is perpendicular. The diameter can vary along the main extension direction. In this case, the ratio of length to maximum diameter of the active region, preferably of all the active regions of the optoelectronic semiconductor chip, is at least one, in particular at least five, for example, between at least five and at most 100.

In this case, the diameter, that is to say the thickness, of the active region can be between at least 20 nm and at most 25 µm. With regard to improving the material quality, in particular with regard to reducing dislocations in the semiconductor material of the active region, active regions having a diameter of at least 100 nm, and at most 3 µm, in particular at most 1 µm, prove to be particularly advantageous. In the case of such thin active regions, dislocations generally do not penetrate through the active region along its entire length, but rather end on account of the small thickness after relatively short path lengths at a lateral surface of the active region, without extending over the entire active region. Furthermore, it is possible that the dislocations extend along the entire length of the core region of the active region, but do not penetrate the active layer on the outer surface of the core region.

In this case, the active regions are preferably arranged in a high density, that is to say with a high filling factor. In this case, the filling factor corresponds to the ratio of the area of the side of the carrier which adjoins the active regions to the total area of the top side of the carrier which is assigned to the active regions. The filling factor is preferably at least 20%, in particular at least 50%, for example, at least 75%. A particularly significant enlargement of the active area of the optoelectronic semiconductor chip is achieved as a result.

In accordance with at least one embodiment of the optoelectronic semiconductor chip, the active region has a current spreading layer, which covers the cover layer at least in directions transversely with respect to the main extension direction, wherein the current spreading layer can be transmissive to electromagnetic radiation generated in the active layer during operation. The current spreading layer serves to distribute an electric current particularly uniformly over the cover layer. In this case, the current spreading layer is in particular in direct contact with the cover layer and can cover the latter partly or completely. If the cover layer is formed with a p-conducting nitride compound semiconductor material, for example, then it has a relatively low transverse conductivity. The current spreading layer therefore leads to a more uniform energization of the active layer of the active region. The current spreading layer covers the cover layer, for example, as a layer which can have a uniform thickness within the scope of production tolerance.

In accordance with at least one embodiment of the optoelectronic semiconductor chip, the current spreading layer is embodied such that it is transmissive to electromagnetic radiation generated in the active region. That is to say that the current spreading layer is radiation-transmissive in this case.

Here and hereinafter, the term "radiation-transmissive" means that the radiation-transmissive component allows at least 75% of the electromagnetic radiation of the active layer passing through it to pass without absorbing said radiation. In this case, the radiation-transmissive component can be embodied such that it is milky, hazy or pellucid, transparent.

In accordance with at least one embodiment of the optoelectronic semiconductor chip, the current spreading layer is formed with a transparent conductive oxide (TCO). By way of example, materials such as ITO or ZnO are suitable for forming the current spreading layer.

In accordance with at least one embodiment of the optoelectronic semiconductor chip, the current spreading layer extends over at least a large portion of the length of the active region. In particular, it is possible for the current spreading layer to uniformly cover and in this case completely cover the cover layer over the entire length of the active region.

In accordance with at least one embodiment of the optoelectronic semiconductor chip, an insulation material is arranged between the multiplicity of active regions, wherein the insulation material can be transmissive to electromagnetic radiation generated in the active layer during operation, and the insulation material surrounds the multiplicity of active regions at least in directions transversely with respect to the main extension direction. In other words, the insulation material is filled into the interspaces between the active regions and the insulation material can fill, in particular completely fill, said interspaces. In this case, the insulation material is embodied such that it is electrically insulating and, if appropriate, radiation-transmissive. By way of example, materials such as aluminum oxide (AlOx), silicon dioxide, silicon nitride, diamond-like carbon or polymers are suitable as insulation materials.

The insulation material is embodied such that it is radiation-transmissive in particular if the current spreading layer is also embodied such that it is radiation-transmissive. If the current spreading layer is embodied as a radiation-nontransmissive metal layer, for example, then the insulation material can also be embodied such that it is radiation-nontransmissive.

Besides an electrical decoupling of the individual active regions, the insulation material provides for protection of the active regions against mechanical damage, atmospheric gases and moisture.

In accordance with at least one embodiment of the optoelectronic semiconductor chip, as an alternative or in addition to the insulation material, it is possible for a functional material to be arranged between the multiplicity of active regions, wherein the functional material surrounds the active regions at least in directions transversely with respect to the main extension direction and the functional material comprises at least one luminescence conversion substance and/or at least one ESD protective material. By way of example, particles of these materials can also be introduced into the insulation material, such that the filled insulation material forms the functional material. The luminescence conversion substance is suitable, for example, for converting at least part of the electromagnetic radiation generated in the active regions into electromagnetic radiation having longer wavelengths. The semiconductor chip then emits mixed radiation, for example, in particular white light. The ESD protective material can be, for example, a varistor material such as ZnO.

In accordance with at least one embodiment of the optoelectronic semiconductor chip, the insulation material at least in places directly adjoins the outer surface of the active region. By way of example, the insulation material completely covers the lateral surface of each active region and there directly adjoins the outermost layer of the active region, in particular the current spreading layer. In this case, the insulation material embeds the active regions.

In accordance with at least one embodiment of the optoelectronic semiconductor chip, a mask layer is arranged at that side of the carrier which faces the multiplicity of active regions, wherein the mask layer has an opening for each of the active regions, the first semiconductor material penetrating through said opening. In order to produce the active regions, by way of example, a mask layer is applied to a layer composed of first semiconductor material or the carrier. The mask layer has openings toward the layer composed of first semiconductor material or toward the carrier. The first semiconductor material, which forms the core region of each active region, then only grows onto the layer composed of first semiconductor material or the carrier in the region of the openings. The position of the active region is determined by the position of the opening. The mask layer can remain in the completed optoelectronic semiconductor chip. First semiconductor material penetrates through its openings.

If the mask layer is not radiation-transmissive, however, it can also be detached from the semiconductor chip. Alternatively, self-assembled growth of the core regions without a mask is also possible. The mask is dispensed with in this case.

In accordance with at least one embodiment of the optoelectronic semiconductor chip, the mask layer is transmissive to electromagnetic radiation generated in the active layer during operation. For this purpose, the mask layer can be formed, for example, from the same material as the insulation layer.

In accordance with at least one embodiment of the optoelectronic semiconductor chip, at the top side of the active region facing away from the carrier, the core region is free of the active layer and is in direct contact with an electrically conductive contact layer. That is to say that the apex of the active region, which is directed away from the carrier, is removed in places, the cover layer and the active layer being removed. In this way, the core region, that is to say in particular the first semiconductor material of the active region, is exposed and can be brought into direct electrical contact with an electrically conductive contact layer.

By way of example, the core region is embodied such that it is n-conducting. That is to say that an n-side contact-connection of the active region is possible by means of the electrically conductive contact layer. In order to suppress short circuits or current leakage paths, the cover layer and, if appropriate, the current spreading layer are separated from the electrically conductive contact layer by a passivation. In this case, the passivation can be in direct contact with the core region of the active region and is then situated at that side of the active region which faces away from the carrier, at the lateral surface of said active region, for example, in direct contact with the cover layer and, if appropriate, the current spreading layer. The passivation can terminate there flush with the top side of the core region facing away from the carrier and can be situated at its side facing away from the carrier in direct contact with the electrically conductive contact layer.

The passivation can be implemented, for example, by the covering of the cover layer and, if appropriate, the current spreading layer with an electrically insulating material or by the passivation of the semiconductor material of the cover layer, for example, by ion implantation or by electrical deactivation of the doping species, for example, in the context of a hydrogen plasma step, or by the production of surface defects by a back-sputtering step.

In accordance with at least one embodiment of the optoelectronic semiconductor chip, the contact layer is in direct contact with the core regions of at least a large portion, in particular all, of the active regions of the optoelectronic semiconductor chip. That is to say that all of the core regions, or at least a large portion of all of the core regions, are electrically conductively connected via a single, common contact layer.

In this case, the contact layer can extend in particular at least in places in a plane running parallel or substantially parallel to the outer surface of the carrier facing the multiplicity of active regions. The active regions are then enclosed between the carrier and the contact layer.

In this case, at least a large portion of the active regions denotes at least 75%, preferably at least 85%, in particular at least 95%, of the active regions of the optoelectronic semiconductor chip. Substantially parallel means that the contact layer at least in places runs in a plane which, within the scope of the production tolerance, runs parallel to the outer surface of the carrier facing the active regions.

In accordance with at least one embodiment of the optoelectronic semiconductor chip, the contact layer is embodied such that it is transmissive or reflective to the electromagnetic radiation generated in the active region during operation. A transmissive contact layer can be formed, for example, with a transparent conductive oxide described above. A reflective contact layer can be formed, for example, with a reflective metal, such as silver, Au, Ti, Pt, Pd, Wf, Os and/or aluminum. In the case of a reflective contact layer, the carrier is preferably embodied such that it is radiation-transmissive and at least a large portion of the electromagnetic radiation emitted by the optoelectronic semiconductor chip during operation is then emitted through the carrier.

In accordance with at least one embodiment of the optoelectronic semiconductor chip, the active region has traces of material removal at its top side facing away from the carrier. That is to say that the core region of the active region is removed, for example, by a material-removing process. At least the core region then has traces of this material removal. By way of example, the material removal can be etching, chemical mechanical polishing (CPM), or sawing. The technique used for material removal produces characteristic traces in the material of the active region, which are detectable as traces of material removal on the finished component.

In this case, it is possible that the area of the core region which is available for a contact-connection by the contact layer is increased on account of the material removal, that is to say the traces. By way of example, that side of the core region which faces away from the carrier has a faceting or a roughening which increases the contact area compared with a planar area. A lower contact resistance is possible in this way.

An optoelectronic semiconductor chip described here is distinguished, inter alia, by the following advantages:

The semiconductor chip can be produced in a particularly cost-saving manner since the number of the required process steps and processes for producing the optoelectronic semiconductor chip is possible with three-dimensional crystal structures, for example, three-dimensional core-shell structures. Furthermore, the contact-connection of the three-dimensional crystal structures can be effected by means of standardized processes, since the contact-connection itself does not require a resolution in the nanometers range, but rather is possible by means of a contact layer extending over all of the active regions. Since a planar epitaxial structure is not required for producing the active regions described here, epitaxial growth can be effected onto also onto non-conventional and/or large-area foreign substrates. In particular, electrically insulating growth substrates can be used. Furthermore, GaN-based semiconductor material grown in the N-face direction can also be used as semiconductor material. Differences in the length of the active regions in the direction of the main extension direction can be compensated for by a planarization step, without in this case impairing the properties of the p-conducting region used for the contact with the p-side. However, it is also possible to dispense with a planarization in order that the available active area of each active region is utilized particularly efficiently.

BRIEF DESCRIPTION OF THE DRAWINGS

Optoelectronic semiconductor chips and methods for producing same as described here are explained in greater detail below in connection with exemplary embodiments and the associated figures.

In connection with FIGS. 1A to 1G, method steps for producing one exemplary embodiment of an optoelectronic semiconductor chip described here are explained in greater detail with reference to schematic sectional illustrations.

In connection with FIGS. 2A to 2I, method steps for producing a further exemplary embodiment of an optoelectronic semiconductor chip described here are explained in greater detail with reference to schematic sectional illustrations.

In connection with FIGS. 3A to 3F, method steps for producing one exemplary embodiment of a further optoelectronic semiconductor chip described here are explained in greater detail with reference to schematic sectional illustrations.

In connection with FIGS. 4A to 4C, method steps for producing a further exemplary embodiment of an optoelectronic semiconductor chip described here are explained in greater detail with reference to schematic sectional illustrations.

Elements that are identical, of identical type or act identically are provided with the same reference signs in the figures. The figures and the size relationships of the elements illustrated in the figures among one another should not be regarded as true to scale. Rather, individual elements may be illustrated with an exaggerated size in order to enable better illustration and/or in order to afford a better understanding.

DETAILED DESCRIPTION OF ILLUSTRATIVE EMBODIMENTS

In connection with FIGS. 1A to 1G, method steps for producing an optoelectronic semiconductor chip described here are explained in greater detail with reference to schematic sectional illustrations. The schematic sectional illustrations in FIGS. 1F and 1G show exemplary embodiments of optoelectronic semiconductor chips described here.

Figure 1A:
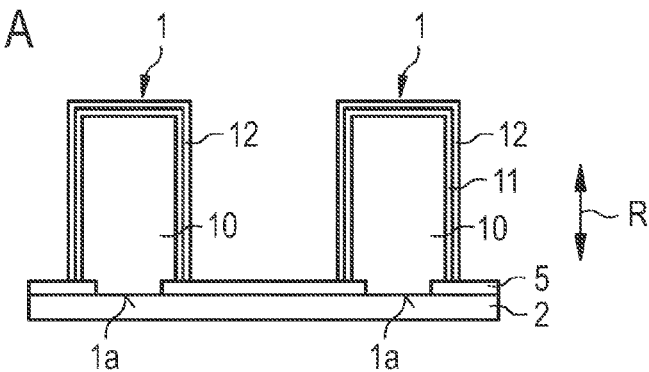

In accordance with FIG. 1A, firstly a carrier 2, which is, for example, a radiation-transmissive, electrically insulating growth substrate such as sapphire or glass, is provided with a mask layer 5. The active regions 1 are grown onto the mask layer 5. In the present case, each active region has the shape of a cylinder, for example. Each active region 1 extends along the main extension direction R. The active regions 1 are arranged, for example, at the lattice points of a regular lattice, for example, of a triangular lattice in the present case.

Each of the active regions 1 comprises a core region 10. In the present case, the core region 10 is formed with an n-doped GaN-based first semiconductor material. The core region 10 likewise has the shape of a cylinder. The lateral surface of said cylinder is completely covered by the active layer 11, in which, for example, electromagnetic radiation is generated during the operation of the optoelectronic semiconductor chip. That side of the core region 10 which faces away from the carrier 2 is also initially covered with material of the active layer 11.

The active layer 11 has the shape of a hollow cylinder, the inner surface of which is completely covered with the first semiconductor material of the core region 10. The outer surface of the active layer 11 is completely covered by a cover layer 12, which can be formed with a p-doped GaN-based second semiconductor material in the exemplary embodiment in FIG. 1.

Figure 1B:
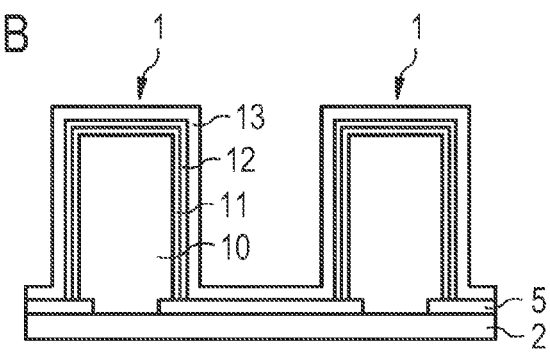

In the subsequent method step, FIG. 1B, the outer surface of the cover layer 12 facing away from the active layer 11 is completely covered with the current spreading layer 13. The current spreading layer 13 is transmissive to electromagnetic radiation generated in the active layer 11 and consists, for example, of a TCO material such as ITO. Alternatively, it is also possible for the cover layer 12 to be covered with an in particular radiation-reflecting contact material, for example, a metal such as silver and/or aluminum, as current spreading layer 13. Furthermore, it is possible for the current spreading layer 13 to fill the intermediate regions between the core regions 10. In this case, the current spreading layer 13 is thus not embodied as a thin layer having, in particular, uniform thickness, rather it forms a filling material between the core regions.

Figure 1C:
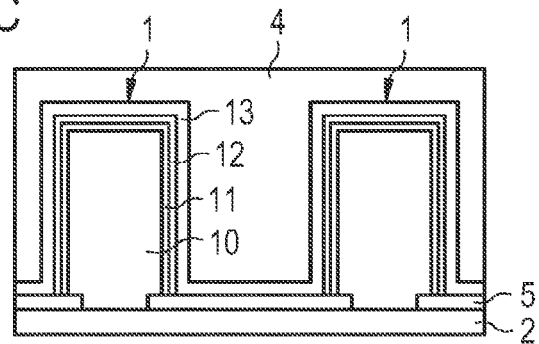

In a subsequent method step, FIG. 1C, the interspaces between the active regions 1 are filled with an insulation material 4. In this case, the insulation material 4 completely covers the active regions 1 also at their side facing away from the carrier 2. The insulation material 4 can directly adjoin the outer surface of the current spreading layer 13 of each active region 1, said outer surface facing away from the core region 10. The insulation material 4 is embodied preferably such that it is transmissive to electromagnetic radiation generated in the active layer 11, and electrically insulating. By way of example, the insulation material 4 consists of silicon dioxide. The insulation material 4 can be applied, for example, by means of spin coating, vapor deposition, sputtering, ALD or CVD.

Optionally, the interspaces between the active regions 1 can also be filled with a functional material which, for example, serves for ESD protection of the optoelectronic semiconductor chip or converts the electromagnetic radiation generated in the active zone into electromagnetic radiation having a different wavelength. The functional material can therefore also be a material which comprises at least one luminescence conversion substance.

Figure 1D:
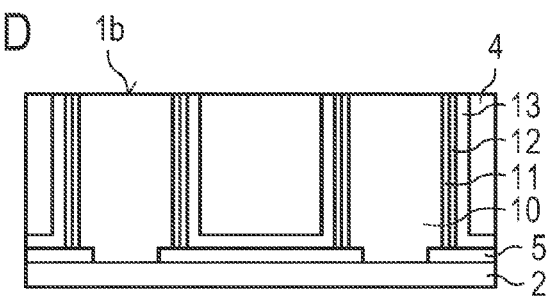

Afterward, FIG. 1D, planarization is effected, for example, by means of chemical mechanical polishing or a dry-chemical process. During the planarization, in the present case, the current spreading layer 13, the cover layer 12 and also the active layer 11 at that side of each active region 1 which faces away from the carrier 2 are removed. That is to say that the core region 10 of each active region is exposed. The core region 10 of each active region has, at its side facing away from the carrier 2, traces of the material removal, and that is to say, for example, of the chemical mechanical polishing or of the dry-chemical process.

Afterward, FIG. 1E, passivations 3 are produced for the cover layers 12 exposed at the edges of the active regions 1, for example, by deactivation of the p-doped cover layers by means of a hydrogen plasma. In the present case, the current spreading layer 13 is also covered by the passivation at its side facing away from the carrier 2.

On account of the passivation 3, during the subsequent contact-connection by the contact layer 6, see, e.g., FIG. 1F or FIG. 1G, a contact between the contact layer 6 and the p-conducting region and the current spreading layer of each active region is prevented.

For the case where the current spreading layer 13 fills the intermediate regions between the core regions 10, the passivation 3 can run on the current spreading layer 13 and in this way covers the regions between the core regions 10.

In accordance with FIG. 1F, a whole-area reflective contact layer is used for contact-connection. In this case, the electromagnetic radiation generated in the active regions 1 is preferably coupled out through the carrier 2. Alternatively it is possible for the contact layer 6 to comprise a dielectric mirror and an electrically conductive region. The electrically conductive region can be formed, for example, with a radiation-transmissive, conductive oxide.

The contact layer 6 is electrically insulated from the current spreading layer 13 by the passivation 3.

In an alternative embodiment, see, e.g., FIG. 1G, the contact layer 6 is formed with a radiation-transmissive, conductive material, for example, a TCO material such as ITO. It is then possible for electromagnetic radiation to be coupled out, for example, also through that side of the contact layer 6 which faces away from the carrier 2. A volume emitter can be produced in this way. In order to improve the coupling-out, that side of the contact layer 6 which faces away from the carrier 2 can contain rougherings that reduce the probability of total internal reflection.

A contact-connection can be effected as indicated in FIGS. 1F and 1G, from the side or else from that side of the contact layer 6 which faces away from the carrier 2.

A further method for producing an optoelectronic semiconductor chip described here is explained in greater detail in FIGS. 2A to 2I. In connection with FIGS. 2H and 2I, exemplary embodiments of an optoelectronic semiconductor chip described here are described in greater detail with reference to sectional illustrations.

Figure 2A:
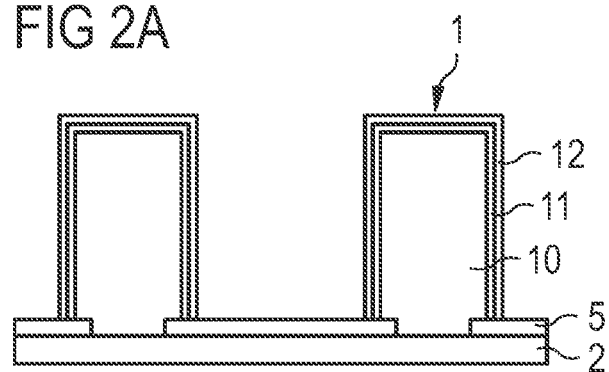
Figure 2B:
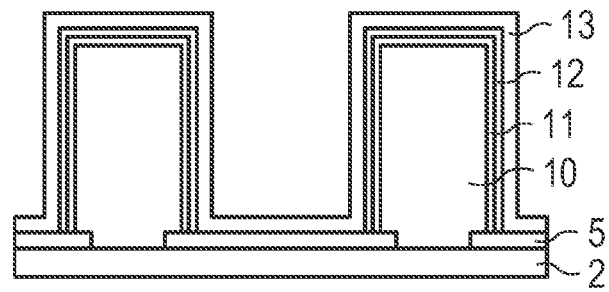
Figure 2C:
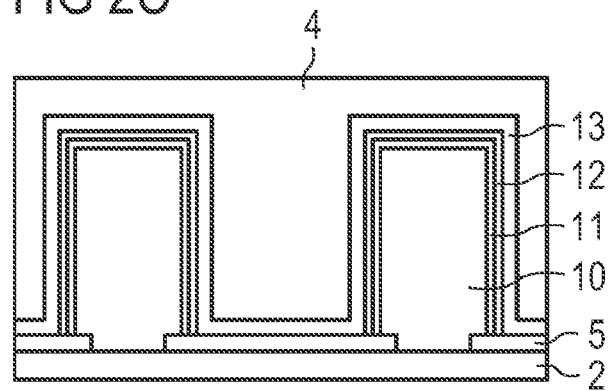
Figure 2D:
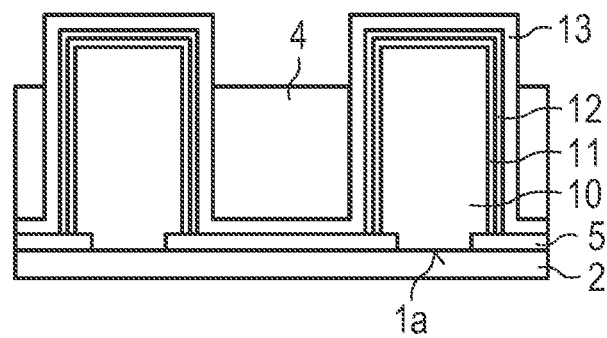
Figure 2E:
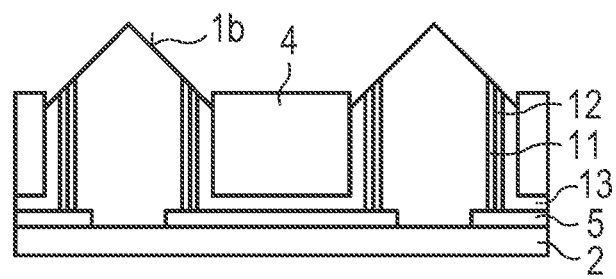

In contrast to the exemplary embodiment described in connection with FIGS. 1A to 1G, in the exemplary embodiment in FIG. 2, the insulation material 4 is etched back until the active regions 1 are exposed again at that side of the insulation material 4 which faces away from the carrier 2, see, e.g., FIG. 2D. Alternatively, it is possible that filling with the insulation material 4 in step 2C is not carried out beyond that side of the active regions 1 which faces away from the carrier 2, rather filling is carried out only up to a specific filling height beyond which the active regions 1 project.

Afterward, the apex of each active region 1 is removed wet-chemically, for example, by etching using hot KOH. On account of the crystal structure of the first semiconductor material used, this leads to a faceting and thus to an enlarged contact area at the core region 10 of each active region 1. By way of example, the top sides 1b of the active regions 1 in the region of the core region have in each case a pyramidal vertex after the wet-chemical process.

Figure 2F:
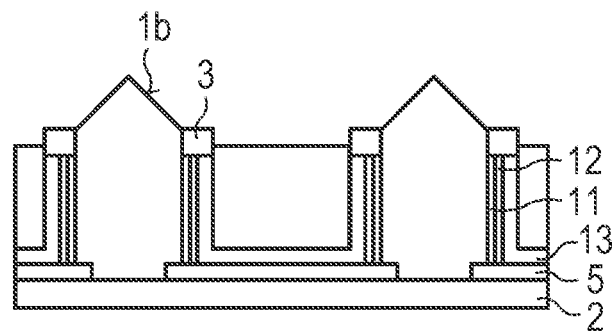
Figure 3A:
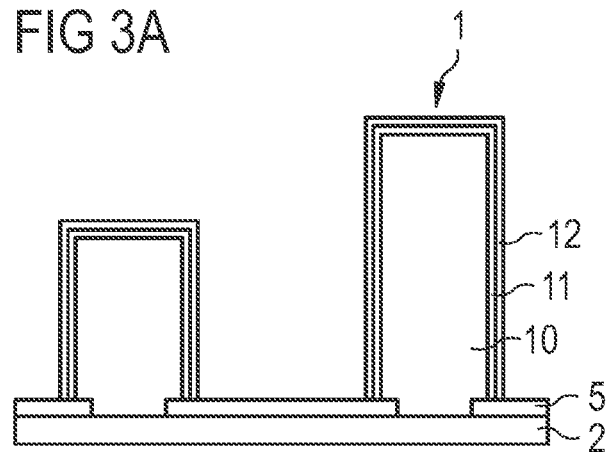
Figure 3B:
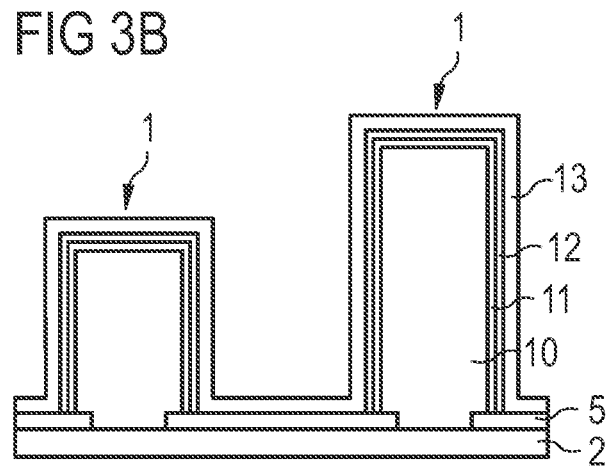
Figure 3C:
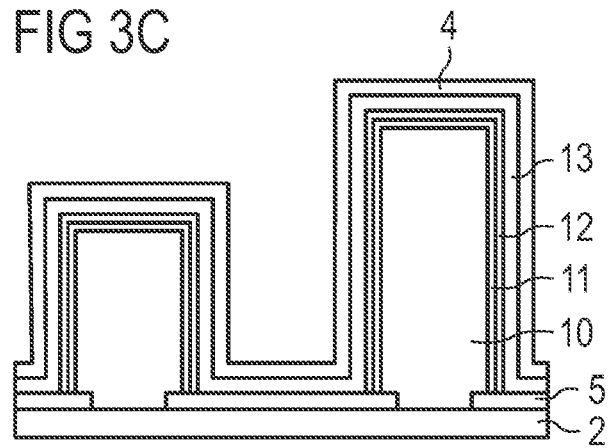
Figure 3D:
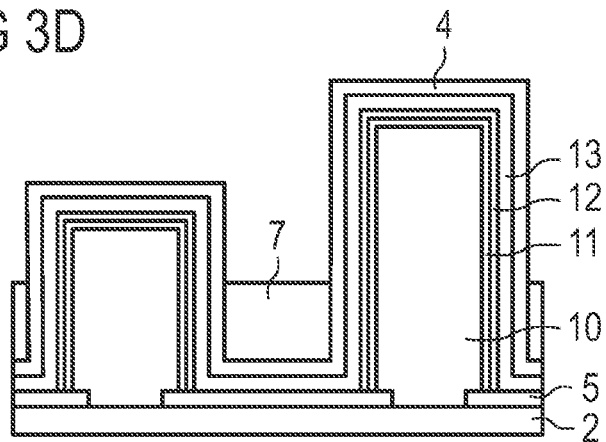
Figure 3E:
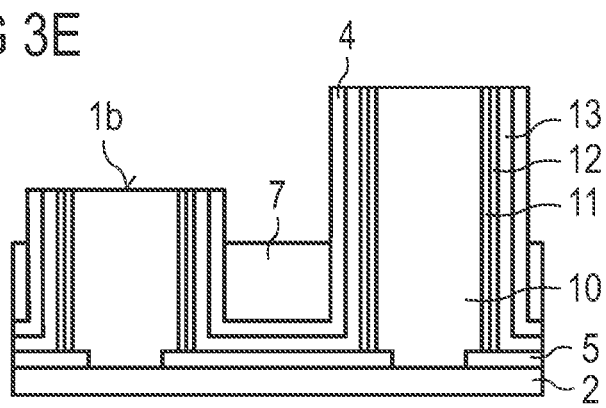
Figure 3F:
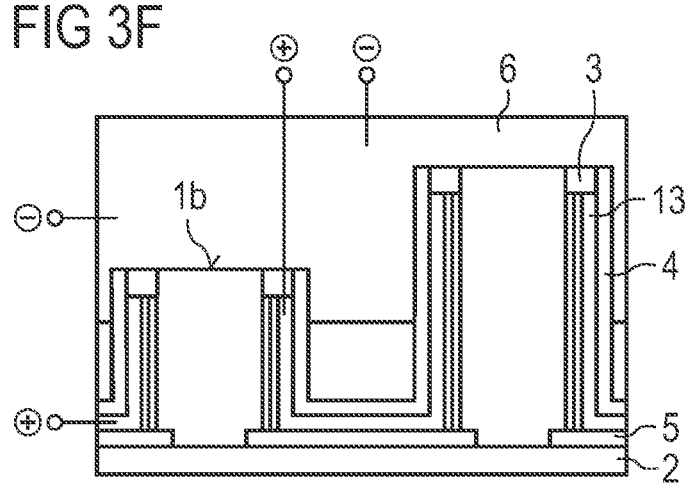

In method step 2F, passivations 3 are once again produced, either as described above by the passivation of the p-conducting semiconductor material or by renewed application of insulation material 4 (in this respect, see, e.g., FIGS. 2F and 2G). Afterward, FIGS. 2H and 2I, the contact-connection is effected by means of contact layers as already explained in connection with FIGS. 1F and 1G. On account of the contact area increased by the faceting, current of particularly high density can be impressed into each core region.

In connection with FIGS. 3A to 3F, a further method for producing an optoelectronic semiconductor chip described here is explained in greater detail. In this method, no planarization step is carried out, that is to say that the length of the active regions 1 is not adapted to one another. In this way, the naturally occurring different lengths of the individual active regions are utilized, that is to say that a largest possible part of the active layer 11 of each active region 1 is utilized efficiently. In method step 3c, therefore, in contrast to the method described above, an insulation material 4 is not applied in an overmolding manner, but rather as a thin layer of high conformity, for example, by an ALD method. In addition, a layer of further insulation material 7 can be introduced between the active regions, which does not project beyond the active regions 1 in the main extension direction R. Afterward, see, e.g., FIG. 3E, the insulation material 4, 7 is removed by etching. As a result of the increased thickness of the insulation material between the active regions 1, the core regions 10 can be exposed at the top sides 1b of the active regions 1, without the passivation material 7 between the active regions 1 being completely removed. Alternatively, it would be conceivable to carry out etching at the top sides 1b of the active regions 1 with an increased etching rate. At all events, the core region 10 of each active region 1 is exposed at the top side 1b facing away from the carrier 2.

The exposure is carried out by means of dry-chemical or wet-chemical processes, for example, by means of plasma etching, for example, by ICP RIE (inductively coupled plasma reactive ion etching), or using KOH, which can additionally lead to a faceting and thus an enlarged contact area in the region of the core region 10 of each active region 1.

Afterward, a passivation 3 is produced as described, for example, in connection with FIG. 2F or FIG. 2G.

Finally, a contact layer 6 is applied to that side of the active regions 1 which faces away from the carrier 2, which contact layer can be embodied in a planarizing fashion. In this case, the contact layer 6 can be embodied such that it is radiation-transmissive or radiation-reflective, as described above.

Figure 4A:
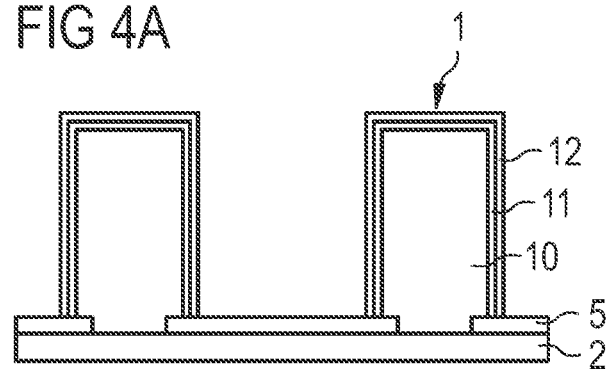
Figure 4B:
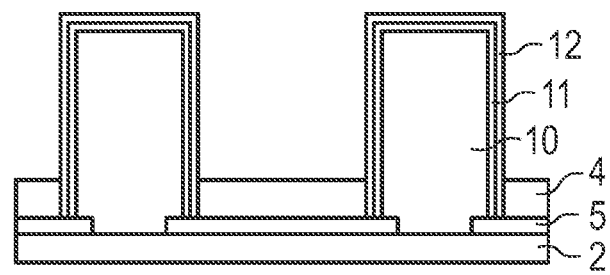
Figure 4C:
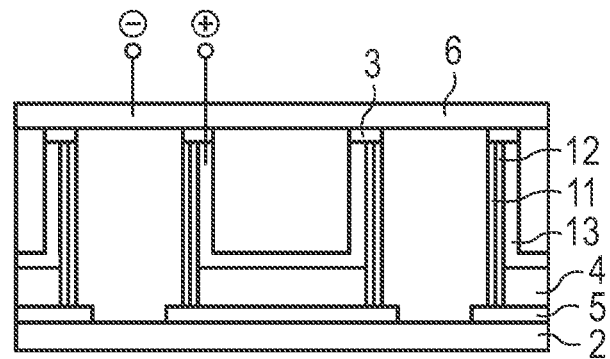

In connection with FIGS. 4A to 4C, a further exemplary embodiment of a method described here is illustrated, which can be used as a modification in relation to the methods described above. FIG. 4C shows a correspondingly produced optoelectronic semiconductor chip in a schematic sectional illustration.

In contrast to the methods described above, in this exemplary embodiment, the current spreading layer 13 is not applied directly to the mask layer 5; rather, before the current spreading layer 13 is applied, the stumps of the active regions 1 are passivated with an insulation material 4. The insulation material 4 can be applied by a spin coating process, for example. The active regions 1 project beyond the insulation material 4 in the direction of the main extension direction R (in this respect, see, e.g., FIG. 4B). Afterward, the further processing takes place, for example, as described in connection with FIGS. 1B to 1G. In this case, the passivation at the stump leads to an optoelectronic semiconductor chip in which the probability of the occurrence of leakage currents is reduced.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An optoelectronic semiconductor chip comprising:
an active region; and
a carrier arranged at an underside of the active region,
wherein the active region has a main extension direction,
wherein the active region has a core region comprising a first semiconductor material, wherein the active region has an active layer that covers the core region at least in directions transversely with respect to the main extension direction of the active region, wherein the active region has a cover layer comprising a second semiconductor material and overlying the active layer at least in the directions transversely with respect to the main extension direction of the active region, wherein the active region has traces of material removal at its top side facing away from the carrier, wherein the active region has a current spreading layer overlying the cover layer at least in the directions transversely with respect to the main extension direction, and wherein the current spreading layer, the cover layer and the active layer are removed at a side of the active region which faces away from the carrier and the core region of the active region is exposed.

2. The optoelectronic semiconductor chip according to claim 1, wherein the first semiconductor material is deposited epitaxially onto the carrier.

3. The optoelectronic semiconductor chip according to claim 2, wherein a growth direction of the first semiconductor material is parallel or substantially parallel to the main extension direction.

4. The optoelectronic semiconductor chip according to claim 1, wherein the active region has a length determined in the main extension direction, and the active region has a diameter determined in a plane perpendicular to the main extension direction, wherein a ratio of the length to the diameter is at least 1.

5. The optoelectronic semiconductor chip according to claim 1, wherein the current spreading layer is transmissive to electromagnetic radiation generated in the active layer during operation and is formed with a transparent conductive oxide.

6. The optoelectronic semiconductor chip according to claim 1, wherein the current spreading layer extends over at least a large portion of a length of the active region.

7. The optoelectronic semiconductor chip according to claim 1, wherein, at the top side of the active region facing away from the carrier, the core region is free of the active layer and is in direct contact with an electrically conductive contact layer.

8. The optoelectronic semiconductor chip according to claim 1, wherein the active region has characteristic traces in the material of the active region that are detectable as traces of material removal on the optoelectronic semiconductor chip.

9. An optoelectronic semiconductor chip comprising:
a plurality of active regions arranged at a distance from one another; and
a carrier arranged at an underside of the active regions,
wherein each active region has a main extension direction,
wherein each active region has a core region comprising a first semiconductor material,
wherein each active region has an active layer that covers the core region at least in directions transversely with respect to the main extension direction of the active region,
wherein each active region has a cover layer comprising a second semiconductor material and overlying the active layer at least in the directions transversely with respect to the main extension direction of the active region,
wherein each active region has traces of material removal at its top side facing away from the carrier,
wherein each active region has a current spreading layer overlying the cover layer at least in the directions transversely with respect to the main extension direction of each active region, and wherein the current spreading layer, the cover layer and the active layer are removed at a side of each active region which faces away from the carrier and the core region of each active region is exposed.

10. The optoelectronic semiconductor chip according to claim 9, wherein at the top side of each active region facing away from the carrier, the core region of that active region is free of the active layer and is in direct contact with an electrically conductive contact layer, and the contact layer is in direct contact with the core regions of the active regions, and extends in places in a plane running parallel or substantially parallel to an outer surface of the carrier facing the plurality of active regions.

11. The optoelectronic semiconductor chip according to claim 10, wherein the contact layer is in direct contact with the core regions of all active regions of the optoelectronic semiconductor chip.

12. The optoelectronic semiconductor chip according to claim 9, further comprising an insulation material arranged between the active regions, wherein the insulation material surrounds the active regions at least in directions transversely with respect to the main extension direction.

13. The optoelectronic semiconductor chip according to claim 12, wherein the insulation material at least in places directly adjoins an outer surface of the active region.

14. The optoelectronic semiconductor chip according to claim 9, further comprising a mask layer arranged at that side of the carrier that faces the active regions, wherein the mask layer has an opening toward the carrier for each of the active regions, the first semiconductor material penetrating through the opening.

15. The optoelectronic semiconductor chip according to claim 14, further comprising an insulation material arranged between the active regions, wherein the mask layer in places directly adjoins the insulation material.

16. The optoelectronic semiconductor chip according to claim 9, wherein, for each active region of the plurality of active regions the core region is free of the active layer and is in direct contact with an electrically conductive contact layer at the top side of the active region facing away from the carrier; and
wherein the contact layer extends in places in a plane running parallel or substantially parallel to an outer surface of the carrier facing the plurality of active regions.

17. The optoelectronic semiconductor chip according to claim 9, further comprising a functional material arranged between the active regions, wherein the functional material surrounds the active regions at least in the directions transversely with respect to the main extension direction and the functional material comprises a luminescence conversion substance and/or an electronic discharge (ESD) protective material.

18. An optoelectronic semiconductor chip comprising:
an active region; and
a carrier arranged at an underside of the active region,
wherein the active region has a main extension direction,
wherein the active region has a core region comprising a first semiconductor material,
wherein the active region has an active layer that covers the core region at least in directions transversely with respect to the main extension direction of the active region; and
wherein the active region has a cover layer comprising a second semiconductor material and overlying the active layer at least in the directions transversely with respect to the main extension direction of the active region, wherein the active region is one of a plurality of active regions, which are arranged at a distance from one another at a top side of each active region facing away from the carrier, the core region of the active region is free of the active layer and is in direct contact with an electrically conductive contact layer, and wherein the contact layer is in direct contact with the core regions of at least a large portion or all of the active regions and extends in places in a plane running parallel or substantially parallel to an outer surface of the carrier facing the plurality of active regions.

19. The optoelectronic semiconductor chip according to claim 18, wherein each active region has a current spreading layer overlying the cover layer at least in the directions transversely with respect to the main extension direction of each active region, wherein the current spreading layer, the cover layer and the active layer are removed at a side of each active region which faces away from the carrier and the core region of each active region is exposed, wherein each active region comprises a passivation at an edge of the active region which covers the current spreading layer, the cover layer and the active layer and electrically insulates the current spreading layer, the cover layer and the active layer from the contact layer, and wherein the passivation of each active region is in direct contact with the contact layer.

* * * * *